US006714903B1

(12) United States Patent
Chu et al.

(10) Patent No.: US 6,714,903 B1
(45) Date of Patent: Mar. 30, 2004

(54) PLACEMENT AND ROUTING OF CIRCUITS USING A COMBINED PROCESSING/BUFFER CELL

(75) Inventors: Wei-Mun Chu, San Jose, CA (US); Sudhakar R. Gouravaram, Fremont, CA (US); Son Nguyen, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 808 days.

(21) Appl. No.: 09/113,995

(22) Filed: Jul. 10, 1998

(51) Int. Cl.[7] .................... G06F 17/10; G06F 7/16
(52) U.S. Cl. .................... 703/19; 716/6; 716/10; 716/2
(58) Field of Search .................... 703/14, 15, 16, 703/17, 19; 716/2, 7, 8, 9, 10, 11, 12, 13, 16

(56) References Cited

U.S. PATENT DOCUMENTS

| | | | | |
|---|---|---|---|---|
| 4,701,860 A | * | 10/1987 | Mader | 364/490 |
| 5,210,701 A | * | 5/1993 | Hana et al. | 364/491 |
| 5,247,668 A | * | 9/1993 | Smith et al. | 395/708 |
| 5,282,148 A | * | 1/1994 | Poirot et al. | 364/491 |
| 5,737,237 A | * | 4/1998 | Tanaka et al. | 364/491 |
| 5,774,371 A | * | 6/1998 | Kawakami | 364/491 |
| 5,784,600 A | * | 7/1998 | Doreswamy et al. | 713/503 |
| 5,798,935 A | * | 8/1998 | Doreswamy et al. | 395/500.07 |
| 5,812,417 A | * | 9/1998 | Young | 364/491 |
| 5,825,661 A | * | 10/1998 | Drumm | 364/491 |
| 5,838,583 A | * | 11/1998 | Varadarajan et al. | 364/491 |
| 5,883,814 A | * | 3/1999 | Luk et al. | 395/500.09 |
| 5,905,669 A | * | 5/1999 | Horita | 365/51 |
| 5,913,101 A | * | 6/1999 | Murofushi et al. | 438/6 |
| 5,946,477 A | * | 8/1999 | Ito | 395/500.1 |

OTHER PUBLICATIONS

"Timing Models for High Level Synthesis", Chariyakul et al., 1992 IEEE.*
"Structured Design Implementation—A Strategy for Implementing Regular Datapaths on FPGAs", Koch et al., 1996 ACM.*
"A Data Path Layout Assembler for High Performance DSP Circuits", Cai et al., IEEE 1990.*
"Behavioral Fault Modeling and Simulation of Phase Locked Loops Using VHDL–A Like Language", Shi et al., 1996 IEEE.*
"Test Evaluation for Complex Mixed Signal IC's by Introducing Layout Dependent Faults", Harvey et al., 1993 IEEE.*

* cited by examiner

Primary Examiner—B. D. Thomson
(74) Attorney, Agent, or Firm—Mitchell, Silberberg & Knupp, LLP

(57) ABSTRACT

A cell for inclusion in a cell library used in designing integrated circuits. The cell includes a signal processing circuit and a buffer circuit for buffering a signal external to an integrated circuit in which the cell is to be included. The cell also includes layout information for specifying a layout of an interconnecting trace between the signal processing circuit and the buffer circuit. The invention is also directed to a method for performing layout and routing during design of an integrated circuit, in which cells are obtained from a cell library, the obtained cells are laid out on an integrated circuit die, interconnections are routed between the cells. According to this aspect of the invention, one of the cells obtained from the cell library, referred to as a combined cell, includes (1) a signal processing circuit; (2) a buffer circuit for buffering a signal external to the integrated circuit in which the combined cell is to be included; and (3) layout information for specifying a layout of an interconnecting trace between the signal processing circuit and the buffer circuit.

30 Claims, 5 Drawing Sheets

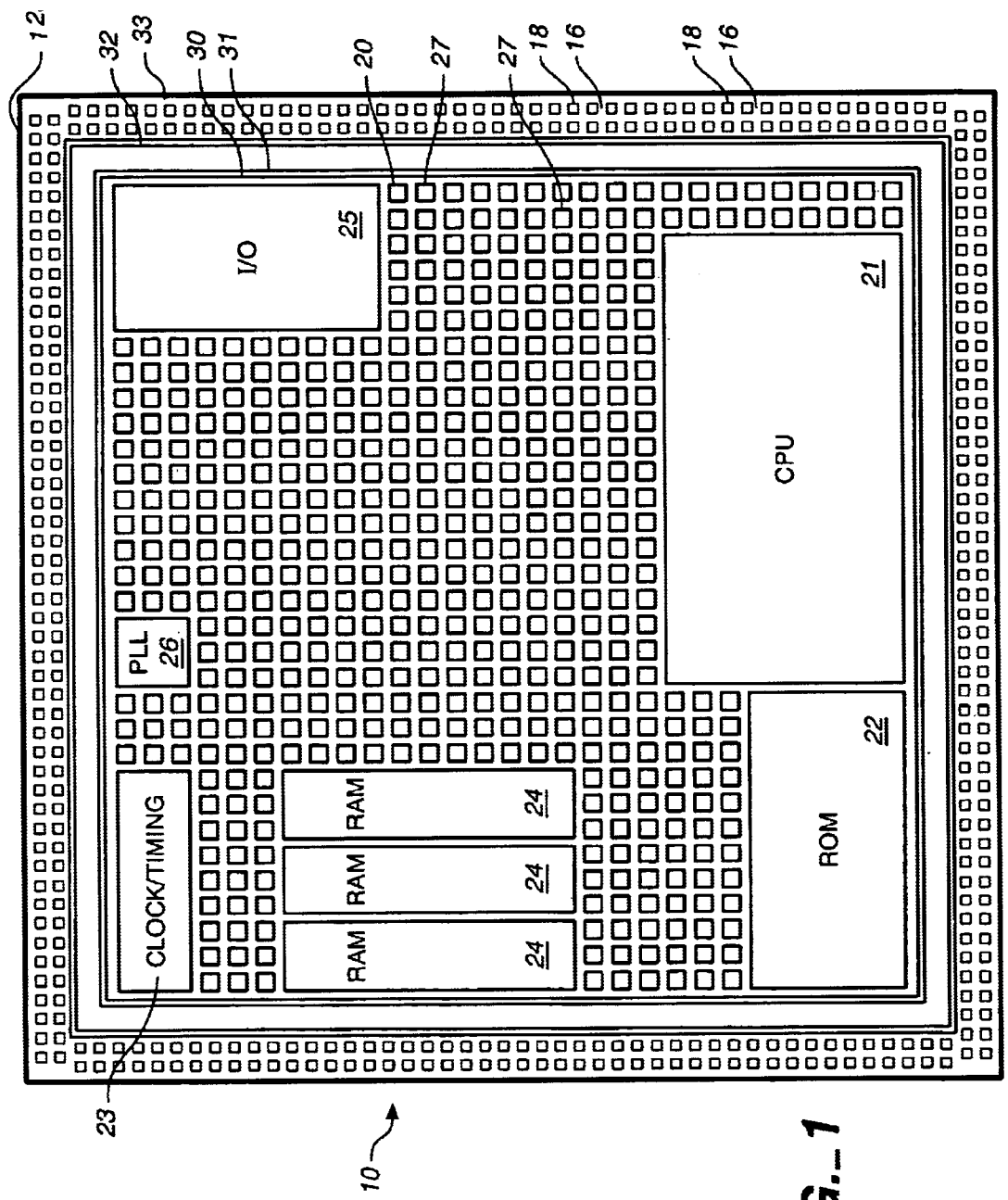
FIG._1

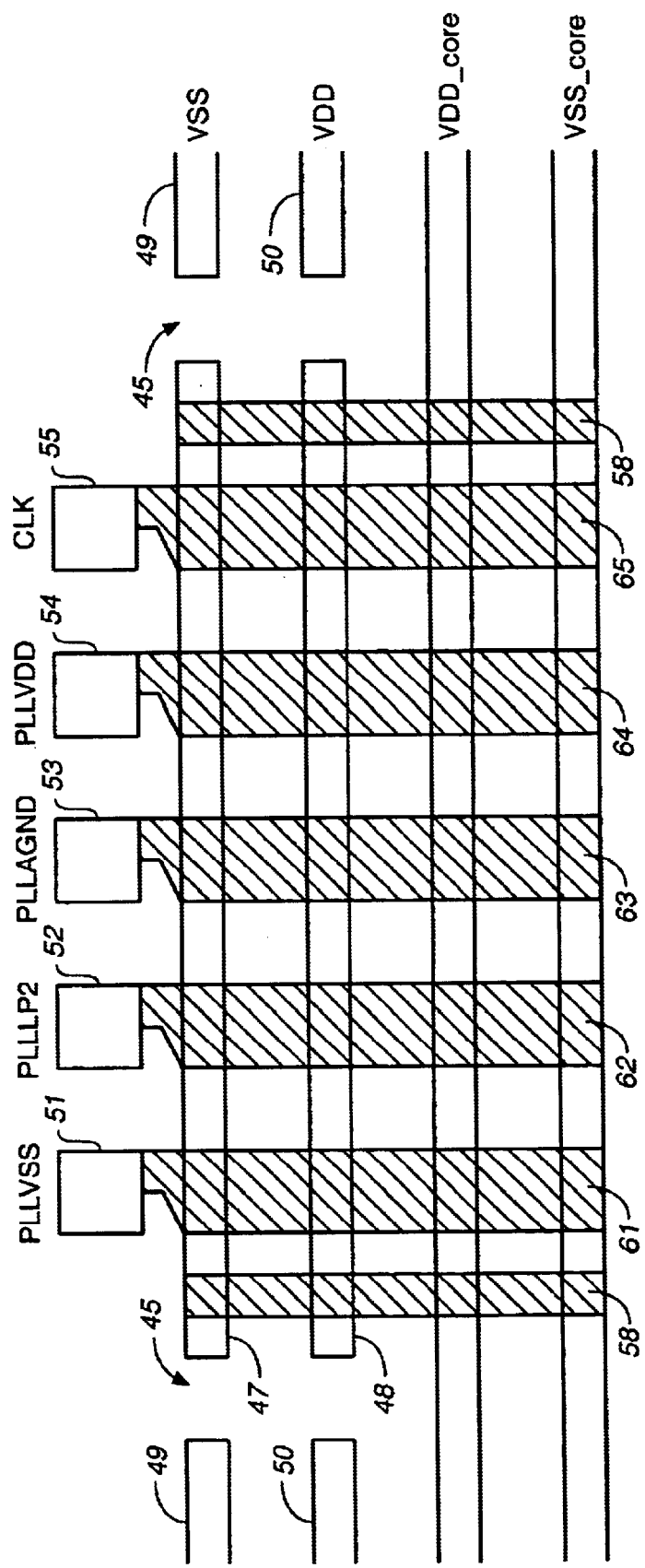
FIG._2

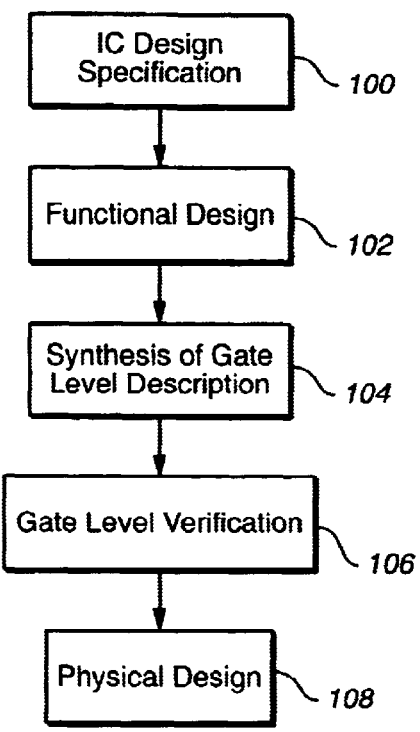
FIG._3
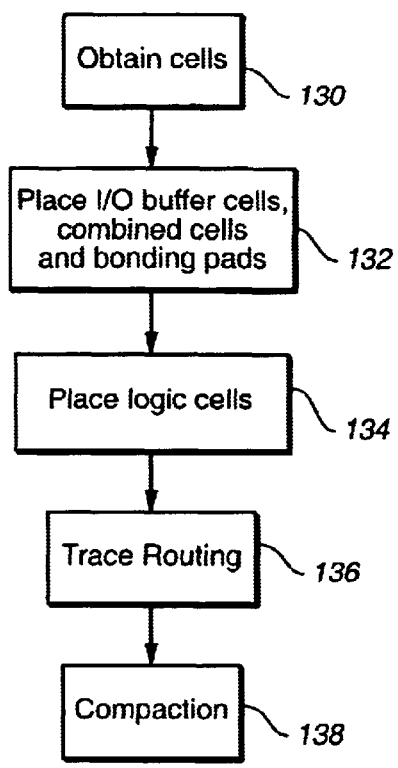
FIG._4
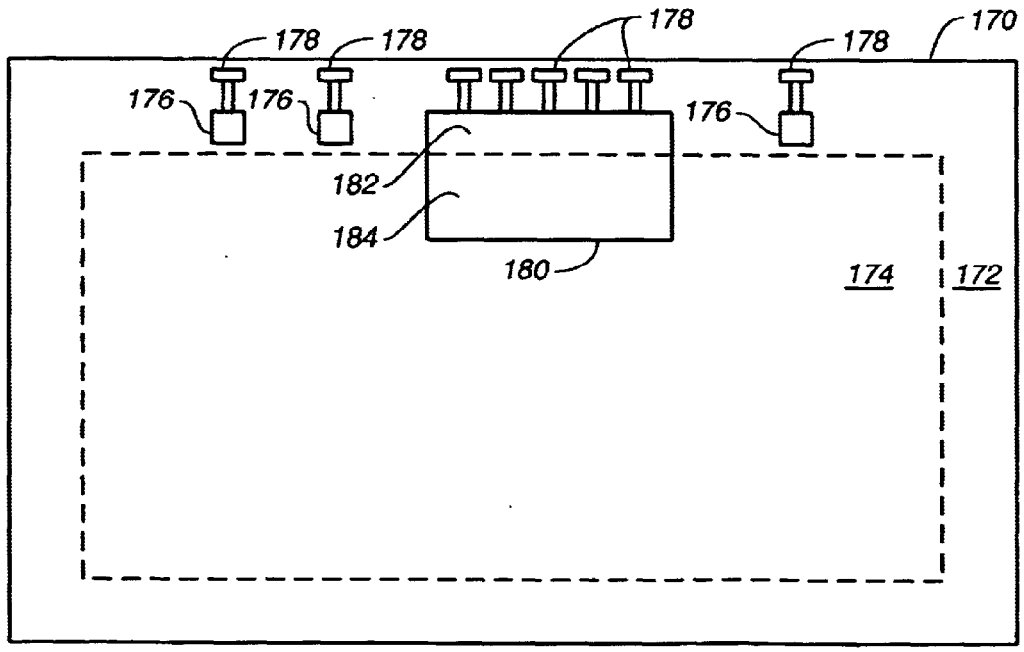
FIG._5

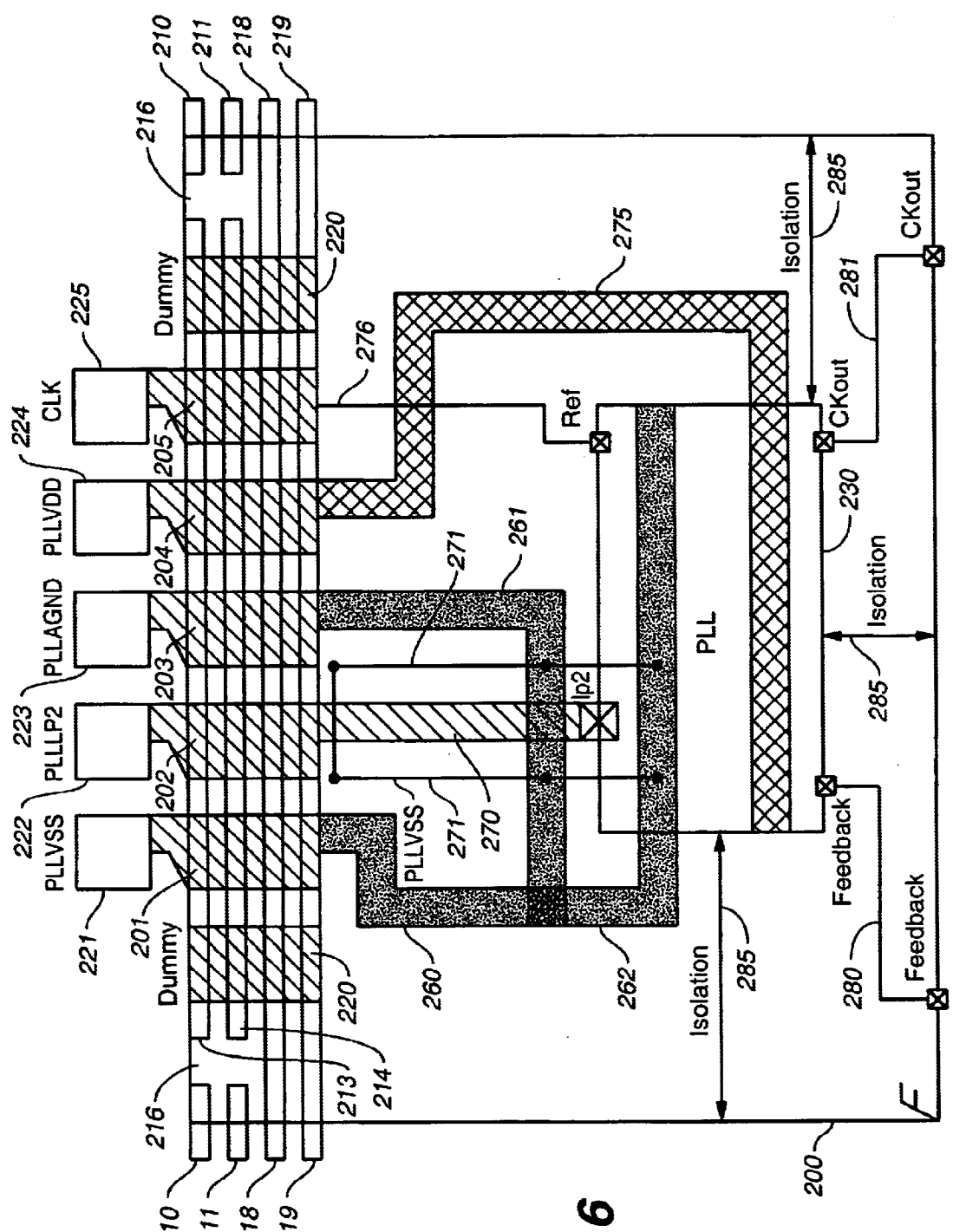
FIG._6

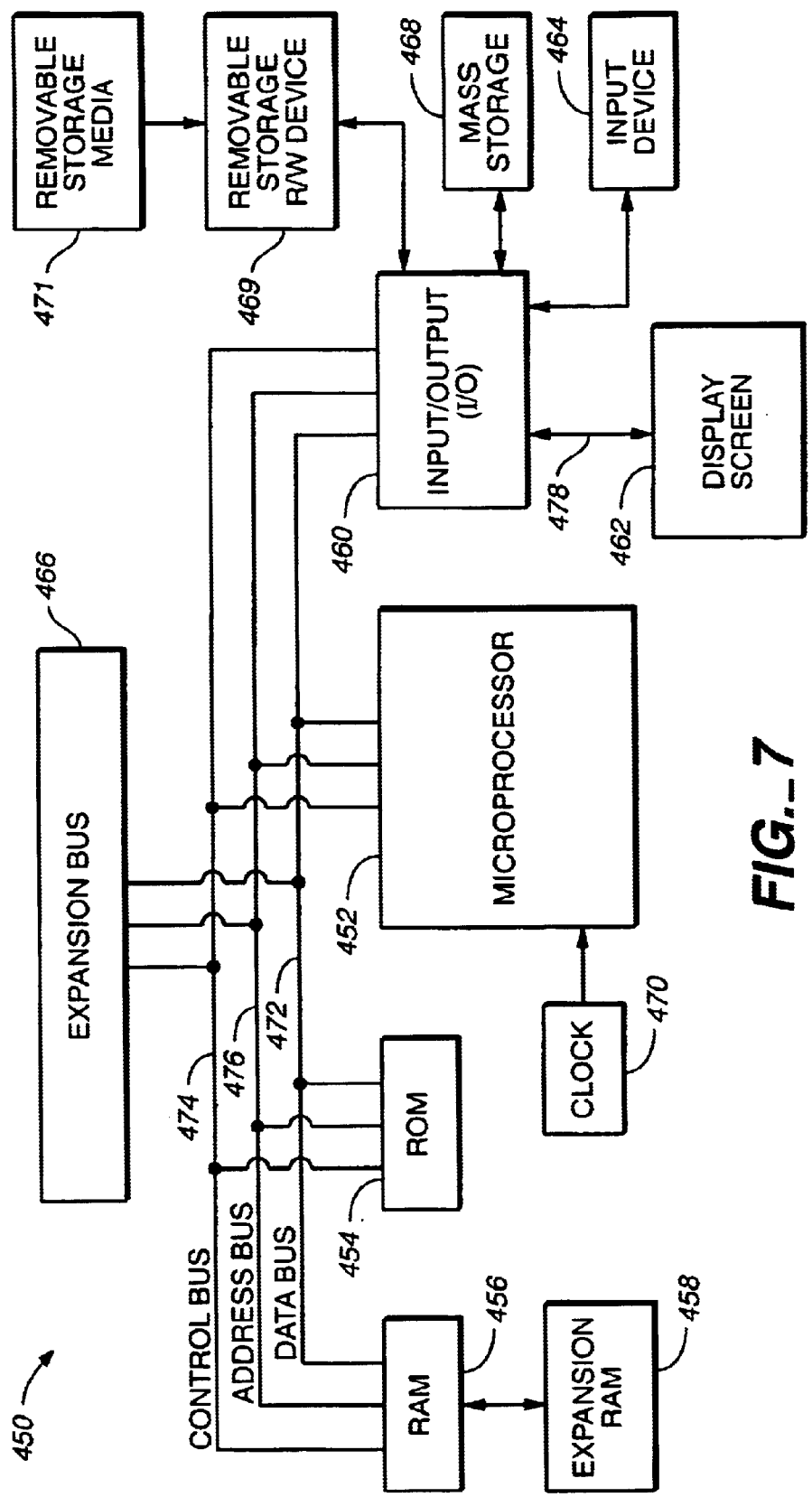
FIG._7

PLACEMENT AND ROUTING OF CIRCUITS USING A COMBINED PROCESSING/BUFFER CELL

BACKGROUND OF THE INVENTION

1. Field of the Invention

The present invention concerns integrated circuit (IC) design, and particularly relates to techniques for placement and routing of circuits during IC design.

2. Description of the Related Art

FIG. 1 provides a representational illustration of a typical integrated circuit (IC) chip (or die) 10 which includes a semiconductor substrate 12, upon which are formed the electronic devices used to implement the chip's functionality. The logic circuitry of the integrated circuit is formed on the interior portion 20 of the semiconductor substrate 12. The logic portion 20 includes a number of functional circuit blocks that can have different sizes and shapes. The larger blocks can include, for example, central processing units such as CPU 21, read-only memories such as ROM 22, clock/timing units such as clock/timing unit 23, random access memories such as RAMs 24, input/output (I/O) units such as I/O unit 25 for providing an interface between CPU 21 and peripheral devices, and phase-locked loops (PLLs) such as PLL 26. These blocks, commonly known as macroblocks, can be considered as modules for use in various circuit designs, and are represented as standard designs in circuit libraries. The logic portion further includes tens of thousands, hundreds of thousands or even millions of additional small cells 27. Each cell 27 represents a single logic element, such as a gate, or several logic elements interconnected in a standardized manner to perform a specific function. Cells that consist of two or more interconnected gates or logic elements are also available as standard modules in circuit libraries. As used herein, the term "cells" refers generically to macroblocks, such as elements 21 to 26, as well as small cells 27.

Along the periphery of the semiconductor substrate are I/O buffer cells 16. More specifically, each of the I/O buffer cells 16 is either a power signal buffer, a ground buffer or an information signal buffer. As used herein, the term "information signal" is defined to mean a signal that conveys any type of information and includes, for example, clock, data, address and control signals. In a wire-bond IC chip, each such buffer cell 16 generally has connected to it at least one metal bonding pad 18 which is used as an electrical connection for an I/O signal.

The wire-bond IC die is mounted within a plastic or ceramic package having multiple pins, and wire connections are made between the die's bonding pads and the package's pins. Finally, the package containing the IC die is mounted onto a printed circuit board in a manner so as to form electrical connections between the pins of the IC and other components on the printed circuit board. In this manner, external signals can be provided to and from the IC die.

Certain of pads 18 are connected to external power (VDD) and ground (VSS). Each such pad is connected to a buffer cell, which in turn is connected to one of the chip's power or ground rings, as the case may be. More specifically, power ring 32 and ground ring 33 supply power and ground to the buffer cells 16. Similarly, power ring 30 and ground ring 31 provide power and ground to the internal logic circuitry 20. In order to isolate the internal logic power and ground from the I/O buffer power and ground, ordinarily certain pad/buffer pairs are connected only to the internal logic power/ground rings 32 and 33, and different pad/buffer pairs are connected only to the buffer power/ground rings. To further isolate the power/ground supplies for certain sensitive circuits from the power/ground supplies for noisier circuits, cuts are made in the rings (not shown). Each resulting ring segment can then be used to supply a different type of circuit. Moreover, although only a single I/O power ring 32 is shown, mixed-voltage integrated circuits may utilize a different power ring for each different voltage.

In integrated circuit design, the physical design is the process of generating, from a circuit description, a design which can be directly fabricated on an IC die. Physical design ordinarily begins with a list of devices (or nets) and interconnections between the nets, called a "netlist". Initially, the physical design phase ordinarily obtains, from a cell library, descriptions for a number of cells corresponding to the nets specified in the netlist. Different cells therefore exist for information signal buffers, power/ground buffers and the various internal logic circuits. Each cell is pre-defined and contains physical design information to implement its circuitry. As a result, physical design need not focus on the transistor-level, but can be accomplished by first laying out the obtained cells across the surface of the semiconductor substrate and then routing connections between the cells.

In more detail, the layout phase of physical design is the process of determining exact physical locations and orientations for each cell. The routing phase of physical design is the process of describing actual physical electrical trace connections between the laid-out cells based on the interconnections specified in the netlist. Completion of layout and routing must result in a physical design that is feasible, in the sense that the design can be implemented physically. Thus, for example, routing must be accomplished in the available space and without undesired wire crossings. In addition, layout and routing ideally should result in a physical design which is as compact as possible, in order to reduce fabrication costs, as well as to minimize the effects of long signal travel times.

However, a typical integrated circuit often will contain tens of thousands, hundreds of thousands or even millions of cells. Accordingly, to accomplish layout and routing relatively quickly and efficiently, computer-aided design (CAD) tools are used extensively. Even with such tools, the physical design problem is believed to be NP-complete, meaning that an exact solution ordinarily can not be obtained in polynomial time. CAD tools therefore typically rely on heuristic rules to obtain a good solution in a reasonable amount of time. Moreover, in order to insure that such CAD tools can be used in a wide variety of circumstances, it is usually desirable to make these heuristics as generally applicable as possible.

Unfortunately, certain circuits included in an IC are especially sensitive to noise. Therefore, it is often desirable to impose additional specific layout and routing rules with respect to each such circuit. However, conforming to these special-case rules often can be difficult when using a more or less general-purpose CAD tool, and modifying the CAD tool to accommodate each such case is often impractical. As a result, when such noise-sensitive circuits are to be implemented in an integrated circuit, significant user input frequently is required.

One example of a noise-sensitive circuit for which additional layout and routing rules are often required is a phase-locked loop (PLL). In one representative case, it has been determined that the following layout and routing rules should be satisfied to effectively isolate a given PLL from noise:

- the PLL should have access to dedicated I/O buffers, power/ground ring cuts and dummy cells arranged as shown in FIG. 2
- the most sensitive PLL signal, LP2, should be routed using multi-grid width wire, and the trace for LP2 should be surrounded on each side by traces for PLLVSS
- no other wire should be closer than a predetermined fixed distance to the PLLVSS wires surrounding LP2
- all PLL power and ground signals should have widths equal to the corresponding PLL terminal widths
- PLLAGND should be shorted to PLLVSS at a location as close to the PLL as possible
- a fixed isolation area should be maintained around the PLL, i.e., no other cells or wires should be placed within the isolation area As noted above, FIG. 2 illustrates the dedicated power, ground and information signal I/O buffers, as well as the power/ground ring arrangement, for the PLL. In FIG. 2, cuts 45 form a PLL VSS segment 47 and a PLL VDD segment 48 from VSS ring 49 and VDD ring 50, respectively. Accordingly, segments 47 and 48 can be used to supply power and ground exclusively to the PLL and its buffers, thereby reducing noise effects from other circuits. Element 51 is the bonding pad for inputting PLLVSS, which is the externally supplied ground signal for the PLL. Bonding pad 52 is for inputting PLLLP2, which is the externally supplied LP2 control signal that controls the voltage-controlled oscillator portion of the PLL. Bonding pad 53 is for inputting PLLAGND, which is the ground signal for an external RC filter. Bonding pad 54 is for inputting PLLVDD, which is the externally supplied power. Bonding pad 55 is for inputting the clock signal CLK. Bonding pads 51 to 55 are implemented on the semiconductor substrate of the IC die, and are electrically connected to corresponding I/O buffers 61 to 65, respectively, also implemented on the semiconductor substrate. The output of buffer 61 (PLLVSS) and the output of buffer 64 (PLLVDD) are connected to PLL VSS segment 47 and PLL VDD segment 48, respectively. The outputs of buffers 62 (PLLLP2), 63 (PLLAGND) and 65 (CLK) are routed to the PLL during the routing phase of physical design, in accordance with the above-specified rules. Finally, as shown in FIG. 2, attached to the PLL segments of the power/ground rings are dummy cells 58 which are padless devices provided for electrostatic discharge (ESD) protection.

Thus, in conventional layout and routing, the user typically is required to remember each of the above special-case rules and to insure that each is implemented. For instance, many CAD layout tools will only route in single-grid width wire. Accordingly, PLLLP2 generally must be routed manually. Similarly, the user must verify that each of the other rules has been satisfied, or else must make appropriate adjustments. This task is complicated by the fact that each different noise-sensitive circuit will ordinarily have its own particular set of special layout and routing rules. As a result, layout and routing of noise-sensitive circuits can be difficult and time-consuming. Moreover, if the user forgets or fails to implement even one of these rules, performance of the IC can be impaired. In addition, subsequent troubleshooting to determine the cause of the impaired performance may prove difficult.

SUMMARY OF THE INVENTION

The present invention addresses the foregoing problems by providing a single cell which includes a signal processing portion, a buffer portion and an interconnection between the two.

According to one aspect, the invention is directed to a cell for inclusion in a cell library used in designing integrated circuits. The cell includes a signal processing circuit and a buffer circuit for buffering a signal external to an integrated circuit in which the cell is to be included. The cell also includes layout information for specifying a layout of an interconnecting trace between the signal processing circuit and the buffer circuit.

According to a further aspect, the invention is directed to a cell for inclusion in a cell library used in designing integrated circuits. The cell includes a buffer circuit for buffering a signal external to an integrated circuit in which the cell is to be included, as well as a noise-sensitive signal processing circuit which performs signal processing unrelated to buffering performed by said buffer circuit. The cell also includes layout information for specifying a layout of an interconnecting trace between the signal processing circuit and the buffer circuit.

According to a still further aspect, the invention is directed to a cell library for use in designing integrated circuits, the library including a cell which includes (1) a signal processing circuit; (2) a buffer circuit for buffering a signal external to an integrated circuit in which the cell is to be included; and (3) layout information for specifying a layout of an interconnecting trace between the signal processing circuit and the buffer circuit.

According to a still further aspect, the invention is directed to a method for performing layout and routing during design of an integrated circuit, in which cells are obtained from a cell library, the obtained cells are laid out on an integrated circuit die, interconnections are routed between the cells. According to this aspect of the invention, one of the cells obtained from the cell library, referred to as a combined cell, includes (1) a signal processing circuit; (2) a buffer circuit for buffering a signal external to the integrated circuit in which the combined cell is to be included; and (3) layout information for specifying a layout of an interconnecting trace between the signal processing circuit and the buffer circuit.

By virtue of the foregoing arrangements, the present invention often can simplify layout and routing for certain signal processing circuits, particularly circuits requiring special layout and/or routing rules. Moreover, the foregoing arrangements often can reduce the chance of user error in neglecting to satisfy any one of such rules.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 1 is a representational view of the semiconductor substrate for a typical integrated circuit die.

FIG. 2 illustrates the pad/buffer and power/ground ring layouts required for a particular implementation of phase-locked loop.

FIG. 3 is a flow diagram illustrating integrated circuit design according to a representative embodiment of the invention.

FIG. 4 is a flow diagram for explaining physical design according to a representative embodiment of the invention.

FIG. 5 illustrates the layout of I/O buffers and combined cells according to a representative embodiment of the invention.

FIG. 6 illustrates a combined cell according to a representative embodiment of the invention.

FIG. 7 is a block diagram of the general purpose computer system, representing one suitable computer platform for implementing the methods of the invention.

DETAILED DESCRIPTION OF THE PREFERRED EMBODIMENTS

The following describes IC design using a combined processing/buffer cell according to a representative embodiment of the invention.

The Design Cycle.

FIG. 3 illustrates a flow diagram for providing a brief overview of IC chip design according to a representative embodiment of the invention. Briefly, according to FIG. 3, an IC design specification is prepared; a functional description of a system corresponding to the design specification is produced; a gate-level circuit description is synthesized from the functional description; a simulation is performed to verify the feasibility of the gate-level description; and physical design is performed.

In more detail, in step 100 an IC design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 102, a functional design is produced. The functional design describes a system that will satisfy the IC design specification prepared in step 100. Preferably, the functional design is written using a highly structured syntax so as to permit subsequent steps in the design cycle to be performed using automated computer-aided design (CAD) tools. More preferably, the functional design is written in a hardware description language (HDL) such as VHDL (IEEE standard 1076-1993) or Verilog-HDL.

In step 104, a description of a gate-level circuit is synthesized based on the HDL code produced in step 102. Preferably, gate-level design is performed by running an automated synthesis tool on the HDL code. Upon execution of the synthesis tool, physically realizable gates and flip-flops are selected from a pre-defined library and are interconnected in a manner so as to satisfy the relationships and to perform the processing defined by the HDL code. Processing by the synthesis tool preferably utilizes pre-defined user design constraints which have been formulated in an effort to enhance the feasibility of the design, particularly with respect to problems which might otherwise not be discovered until later in the design cycle. The format of the gate-level circuit description synthesized in step 104 is a "netlist", which categorizes a number of "nets", each including one or more gates and/or flip-flops, and which also describes the interconnections between these nets.

In gate-level verification step 106, a computer simulation is run to test the circuit design synthesized during gate-level design step 104. The goals of this simulation are to determine whether all performance criteria have been met and whether any timing or other circuit errors will occur in response to a variety of different input signals and conditions. Upon completion of gate-level verification is step 106, the netlist is provided to physical design step 108, and a dump of top-level signals in the netlist is provided to the user.

In physical design step 108, the netlist generated in step 106 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 108 is to implement the design using minimum chip area. Other factors considered during physical design include thermal generation, power/ground noise, electromagnetic effects and the number of metal layers available for wire routing.

Step 108 produces a set of design files in an unambiguous representation known as an intermediate form that describes the layout. The design files are then converted into pattern generator files that are used to produce patterns called masks by an optical or electron beam pattern generator. The preferred implementation of physical design step 108 is discussed below in more detail in connection with FIG. 4.

It should be noted that while the foregoing design cycle is preferred, variations of the foregoing may also be used, as will be apparent to those skilled in the art. In addition, although the foregoing design process is described above and shown in FIG. 3 as being purely sequential, many times one or more of the steps will need to be repeated. That is, if the design is found to be unfeasible at one step, an earlier step might need to be re-executed to correct the problem. For example, it might occur that in step 104 a gate-level description can not be generated to satisfy the functional design requirements using the available technology library, while at the same time maintaining the user's design constraints. In this case, the functional description may need to be redesigned in step 102 in order to achieve a feasible design.

Physical Design.

A more detailed discussion of physical design step 108 (shown in FIG. 3) in the preferred embodiment of the invention will now be discussed with reference to the flow diagram shown in FIG. 4. Briefly, according to FIG. 4, cells are obtained based on the supplied netlist; buffer cells, combined cells and associated bonding pads are laid out around the periphery of the die; interior logic cells are laid out; traces are routed between the cells and from the cells to the power and ground rings; and compaction is performed.

In more detail, in step 130 cell descriptions are obtained from a cell library based on the netlist input from step 106. Specifically, logic and other signal processing cells, I/O buffer cells and combined cells are obtained corresponding to the circuits identified in the netlist. Each combined cell includes a signal processing circuit, which may perform digital, analog or both digital and analog signal processing, as well as at least one buffer circuit for buffering a signal input into or output out of the integrated circuit. As discussed in greater detail below, in the preferred embodiment of the invention, combined cells are provided in the cell library for certain types of signal processing circuits, such as noise-sensitive circuits.

In step 132 the I/O buffer cells, combined cells and corresponding bonding pads are laid out (or placed) around the periphery of the die. Preferably, placement of the combined cells is subject to the same rules as placement of I/O buffer cells. An example of placement is illustrated in FIG. 5. As shown in FIG. 5, die 170 includes a peripheral portion 172 and an interior logic portion 174. Placed along peripheral portion 172 are I/O buffer cells 176 and electrically connected I/O bonding pads 178. Combined cell 180 includes a portion 182 which lies in peripheral portion 172 and a portion 184 which lies in interior logic portion 174. As noted above, the placement rules for combined cell 180 are the same as for I/O buffer cells 176 (i.e., pad-to-pad, cell-to-cell and pad-to-wire spacing requirements must be maintained). Accordingly, when placing combined cell 180 in the preferred embodiment, the presence of interior logic portion 184 generally can be ignored in this step. Preferably, the order in which I/O buffer cells and combined cells are placed around the die's periphery is selected by the user from the dump of top-level signals output in step 106.

Returning to FIG. 4, in step 134 the logic cells are placed at the interior 174 of the die. A main concern in performing this placement is to reduce spacing between cells, thereby minimizing the amount of wire routing that will need to be performed. The main sub-steps in performing step 134 are partitioning, floorplanning and layout.

The logic portion of a chip may contain several million transistors. As a result, layout of the entire chip generally cannot be handled due to the limitations of available memory space and computation power. Therefore, the logic circuitry normally is partitioned by grouping circuit components into blocks, such as subcircuits and modules. The actual partitioning process considers many factors such as the size of the blocks, number of blocks and number of interconnections between the blocks.

The output of partitioning is a set of blocks, together with the interconnections required between these blocks. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications. As described below, a combined cell placed in step 132 may contain a placement-blocking command which prevents other interior cells from encroaching upon the combined cell.

In step 136, traces are routed from the I/O cells and interior logic cells to other I/O and interior logic cells, as well as to power and ground rings. The objective of routing is to complete all the interconnections between blocks according to the specified netlist, subject to the space available for routing. First, the space not occupied by blocks, which is called the routing space, is partitioned into rectangular regions called channels and switch boxes. The goal of a router is to complete all circuit connections using the shortest possible wire length and using only the channel and switch boxes. As described below, a combined cell may include a route-blocking command which prevents other wires from encroaching upon the area of the combined cell.

Routing preferably is done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

In addition to routing on the silicon substrate, the integrated circuit may be provided with one or more metal layers for routing. These metal layers are separated from the silicon layer and from each other by insulating layers, and can be used for forming metal traces. Electrical connections called vias are then made between the metal layers and the semiconductor substrate. Use of such metal layers often can free up space on the semiconductor substrate for implementing additional electronic devices.

In step 138, compaction is performed. Compaction is the process of compressing the layout in both directions such that the total area is reduced. By making the chips smaller, wire lengths are reduced, which in turn reduces the signal delay between components of the circuit. At the same time, a smaller area enables more chips to be produced on a wafer, which in turn reduces the cost of manufacturing. Compaction must ensure that no rules regarding the design and fabrication processes are violated.

As is the case with the overall design cycle process, while the foregoing implementation of the physical design phase is preferable, other variations apparent to those skilled in the art may also be used. Moreover, although the steps are described above and shown in FIG. 4 as being entirely sequential, it should be understood that feasibility problems discovered in any one of the steps frequently will require repeating a prior step. For example, routing problems discovered in step 136 might require adjustments to layout by re-executing portions of step 134.

Combined Cells.

A representative embodiment of a combined cell according to the invention is shown in FIG. 6. Specifically, FIG. 6 is a top-level illustration of a combined PLL/buffer cell 200 according to the invention. Combined cell 200 includes PLLVSS buffer 201, PLLLP2 buffer 202, PLLAGND buffer 203, PLLVDD buffer 204, CLK buffer 205 and dummy cells 220 in the semiconductor substrate layer of the IC die. Upon placement on an IC die, buffers 201 to 205 are intended to connect to pads 221 to 225, respectively.

Combined cell 200 also specifies traces 210 and 211 having cuts 216 to form PLL VSS segment 213 and PLL VDD segment 214, respectively, as well as traces 218 and 219. Each of traces 210, 211, 213 and 214 is preferably specified in one of the die's metal layers. A via connects the output of PLLVSS buffer 201 to PLL VSS segment 213, and another via connects the output of PLLVDD buffer 204 to PLL VDD segment 214. When placed on the die, trace 210 connects to the IC's I/O buffer VSS ring, trace 211 connects to the IC's I/O buffer VDD ring, trace 218 connects to the IC's core logic VDD ring, and trace 219 connects to the IC's core logic VSS ring.

Also included in combined cell 200 is PLL circuit 230. As shown in FIG. 6, trace 260 routed from PLL VSS segment 213 and trace 261 routed from the output of PLLAGND buffer 203 (both in one of the die's metal layers) connect near PLL 230, and the merged wire 262 connects to PLL 230 using a via. A trace 270 routed from PLLLP2 buffer 202 also connects to PLL 230, and is surrounded by traces 271 and 272 which are connected to the PLLVSS signal. Trace 275 connects PLL 230 to PLL VDD segment 214, and trace 276 connects PLL 230 to the output of CLK buffer 205. Trace 280 provides a feedback signal from PLL 230 to the outer edge of cell 200 for connection to other internal logic cells, and trace 281 provides a CKOUT signal from PLL 230 to the outer edge of cell 200 for connection to other internal logic cells. As can be seen from FIG. 6, implementation of combined cell 200 requires at least two metal layers for wire routing.

Combined cell 200 thus includes complete layout and routing information between PLL 230 and buffers 201 to 205, as well as internally for PLL 230 and buffers 201 to 205. Moreover, the layout and routing for combined cell 200 has been pre-configured to satisfy the special layout and routing rules applicable to a PLL, as set forth above. In this regard, combined cell 200 includes a placement-blocking statement, in response to which the layout phase of physical design refrains from allowing any other cells to encroach within the boundaries of cell 200. Similarly, combined cell 200 includes a route-blocking statement, in response to which the routing phase refrains from routing any other wires in any layer of the die within the area occupied by cell 200. As a result, the required isolation area 285 around PLL 230 is maintained.

Thus, in order to address the difficulties of laying out and routing certain circuits in IC design, particularly noise-sensitive circuits, the present invention utilizes a cell which is predefined to include both a buffer circuit and a signal processing circuit. By including both a buffer circuit and a signal processing circuit in the same cell, any special layout and/or routing rules applicable to the signal processing circuit can be accommodated during cell design. As a result, those special rules need not be considered during the physical design phase of IC design. Because the cell is designed only once, addressing these special rules during cell design can be more efficient. In addition, because the cell is pre-designed to accommodate these rules, there generally will be less of a burden on the user to remember them and, consequently, less likelihood of error.

The foregoing description concerns a PLL/buffer combination. However, the invention is not limited to this particular combination. Rather, the invention is applicable to a combination of any other signal processing circuit with one or more buffer circuits for buffering power, ground and/or I/O signals input to or output from an integrated circuit. As indicated above, the invention is particularly applicable to combinations involving noise-sensitive signal processing circuits such as PLLs and to combinations where substantial signal processing, more than processing which is merely incidental to the buffering, is performed by the signal processing circuit.

Fabrication.

Upon completion of design, as described above, the integrated circuit can be fabricated using the masks generated in step 108 (shown in FIG. 3), but otherwise employing conventional fabrication techniques. During fabrication, the masks generated in step 108 are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment.

Generally, the methods described herein with respect to IC design will be practiced with a general purpose computer, either with a single processor or multiple processors. FIG. 7 is block diagram of a general purpose computer system, representing one of many suitable computer platforms for implementing the methods described above. FIG. 7 shows a general purpose computer system 450 in accordance with the present invention. As shown in FIG. 7, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto. For instance, use of combined processing/buffer cells has been described above with respect to design of a wire-bond integrated circuit. However, as will be apparent to those skilled in the art, a similar method using such combined processing/buffer cells also may be implemented for design of flip-chip ICs.

In the following claims, those elements which do not include the words "means for" are intended not to be interpreted under 35 U.S.C. § 112 ¶ 6.

What is claimed is:

1. A cell for inclusion in a cell library used in designing integrated circuits, comprising:
   a signal processing circuit;
   a buffer circuit for buffering a signal external to an integrated circuit in which said cell is to be included; and
   layout information for specifying a layout of an interconnecting trace between said signal processing circuit and said buffer circuit.

2. A cell according to claim 1, wherein said layout information uniquely determines trace routing between said signal processing circuit and said buffer circuit.

3. A cell according to claim 1, wherein said signal processing circuit is noise-sensitive.

4. A cell according to claim 3, wherein layout within said cell has been designed to satisfy rules based on noise-sensitivity of said signal processing circuit.

5. A cell according to claim 1, wherein said signal processing circuit performs signal processing which is unrelated to buffering performed by said buffer circuit.

6. A cell according to claim 1, further comprising at least one additional buffer circuit.

7. A cell according to claim 1, wherein said signal processing circuit inputs a power signal, a ground signal and an information signal.

8. A cell according to claim 1, wherein said signal processing circuit inputs a power signal and a ground signal and outputs an information signal.

9. A cell according to claim 1, wherein said signal processing circuit comprises a phase-locked loop.

10. A cell according to claim 1, wherein the signal buffered by said buffer circuit is input into the integrated circuit.

11. A cell according to claim 1, wherein the signal buffered by said buffer circuit is output from the integrated circuit.

12. A cell according to claim 1, wherein said buffer circuit buffers one of a power signal and a ground signal.

13. A cell according to claim 1, wherein said buffer circuit buffers an information signal.

14. A cell for inclusion in a cell library used in designing integrated circuits, comprising:
   a buffer circuit for buffering a signal external to an integrated circuit in which said cell is to be included;
   a noise-sensitive signal processing circuit which performs signal processing unrelated to buffering performed by said buffer circuit; and
   layout information for specifying a layout of an interconnecting trace between said signal processing circuit and said buffer circuit.

15. A cell according to claim 14, wherein layout within said cell has been designed to satisfy rules based on noise-sensitivity of said signal processing circuit.

16. A cell according to claim 14, further comprising at least one additional buffer circuit.

17. A cell according to claim 14, wherein said signal processing circuit comprises a phase-locked loop.

18. A cell according to claim 14, wherein said signal processing circuit inputs a power signal, a ground signal and an information signal.

19. A cell library for use in designing integrated circuits, comprising:
- a cell which includes (1) a signal processing circuit; (2) a buffer circuit for buffering a signal external to an integrated circuit in which said cell is to be included; and (3) layout information for specifying a layout of an interconnecting trace between said signal processing circuit and said buffer circuit.

20. A method for performing layout and routing during design of an integrated circuit, comprising:
- an obtaining step of obtaining cells from a cell library;
- a layout step of laying out the cells on an integrated circuit die; and
- a routing step of routing interconnections between the cells,
- wherein one of the cells obtained from the cell library, referred to as a combined cell, includes (1) a signal processing circuit; (2) a buffer circuit for buffering a signal external to the integrated circuit in which the combined cell is to be included; and (3) layout information for specifying a layout of an interconnecting trace between the signal processing circuit and the buffer circuit.

21. A method according to claim 20, wherein in said layout step the combined cell is laid out based on layout rules for a buffer cell.

22. A method according to claim 20, wherein the combined cell includes a statement that precludes other cells and traces from encroaching on the combined cell during said layout step and said routing step.

23. A method according to claim 20, wherein the signal processing circuit comprises a phase-locked loop.

24. A method according to claim 20, wherein the layout information uniquely determines trace routing between the signal processing circuit and the buffer circuit.

25. A method according to claim 20, wherein the signal processing circuit is noise-sensitive.

26. A method according to claim 25, wherein layout within the combined cell has been designed to satisfy rules based on noise-sensitivity of the signal processing circuit.

27. A method according to claim 20, wherein the signal processing circuit performs signal processing which is unrelated to buffering performed by the buffer circuit.

28. A method according to claim 20, wherein the combined cell further comprises at least one additional buffer circuit.

29. An apparatus for performing layout and routing during design of an integrated circuit, comprising:
- a processor for executing stored program instruction steps; and
- a memory connected to the processor for storing the program instruction steps,
- wherein the program instruction steps include: (1) an obtaining step to obtain cells from a cell library; (2) a layout step to lay out the cells on an integrated circuit die; and (3) a routing step to route interconnections between the cells,
- wherein one of the cells, referred to as a combined cell, includes a signal processing circuit; a buffer circuit for buffering a signal external to the integrated circuit in which the combined cell is to be included; and layout information for specifying a layout of an interconnecting trace between the signal processing circuit and the buffer circuit.

30. Computer-executable process steps stored on a computer readable medium, said process steps for performing layout and routing during design of an integrated circuit, said process steps comprising:
- an obtaining step to obtain cells from a cell library;
- a layout step to lay out the cells on an integrated circuit die; and
- a routing step to route interconnections between the cells,
- wherein one of the cells, referred to as a combined cell, includes (1) a signal processing circuit; (2) a buffer circuit for buffering a signal external to the integrated circuit in which the combined cell is to be included; and (3) layout information for specifying a layout of an interconnecting trace between the signal processing circuit and the buffer circuit.

* * * * *